(12) United States Patent
Guo et al.

(10) Patent No.: US 11,422,207 B2
(45) Date of Patent: Aug. 23, 2022

(54) CONFIGURABLE AC/DC SENSOR READOUT ARCHITECTURE

(71) Applicant: Apple Inc., Cupertino, CA (US)

(72) Inventors: Jian Guo, Milpitas, CA (US); Harish Venkataraman, Half Moon Bay, CA (US)

(73) Assignee: Apple Inc., Cupertino, CA (US)

( * ) Notice: Subject to any disclaimer, the term of this patent is extended or adjusted under 35 U.S.C. 154(b) by 200 days.

(21) Appl. No.: 16/584,859

(22) Filed: Sep. 26, 2019

(65) Prior Publication Data

US 2020/0103473 A1    Apr. 2, 2020

Related U.S. Application Data

(60) Provisional application No. 62/737,314, filed on Sep. 27, 2018.

(51) Int. Cl.
  *G01R 33/00*    (2006.01)
  *G01V 3/10*    (2006.01)

(52) U.S. Cl.
  CPC ............ *G01R 33/0029* (2013.01); *G01V 3/10* (2013.01)

(58) Field of Classification Search
  CPC ................................................ G01R 33/0029
  See application file for complete search history.

(56) References Cited

U.S. PATENT DOCUMENTS

| | | | |
|---|---|---|---|
| 5,729,129 A | 3/1998 | Acker | |
| 7,642,788 B2 | 1/2010 | Gallavan | |
| 8,664,942 B2 | 3/2014 | May | |
| 8,699,947 B2 | 4/2014 | Nystrom et al. | |
| 9,733,275 B2 * | 8/2017 | Deliwala | .................... G01J 1/44 |
| 9,791,518 B2 | 10/2017 | Aoki et al. | |
| 10,551,451 B2 * | 2/2020 | Trakimas | ............. G01R 33/543 |
| 2020/0103252 A1 | 4/2020 | Gider et al. | |

FOREIGN PATENT DOCUMENTS

EP    2653846    4/2012

* cited by examiner

*Primary Examiner* — Walter L Lindsay, Jr.
*Assistant Examiner* — Milton Gonzalez
(74) *Attorney, Agent, or Firm* — Fish & Richardson P.C.

(57) ABSTRACT

A configurable AC/DC readout architecture that can be operated in an AC measurement mode or a DC measurement mode is disclosed. The configurable AC/DC architecture can utilize shared circuitry such as amplifiers and analog-to-digital converters (ADCs). The configurable AC/DC readout can be used other sensor configurations where both AC and DC measurement signals can captured and require readout and conversion to digital signals. The configurable AC/DC readout architecture can include a filter configured to filter out a DC signal component in the AC measurement mode. The configurable AC/DC readout architecture can include a bypass witch to bypass the filter in the DC measurement mode. A programmable gain amplifier can adjust the signal amplitude of DC or AC signals to allow use of a shared analog-to-digital converter.

6 Claims, 7 Drawing Sheets

CONFIGURABLE AC/DC SENSOR READOUT ARCHITECTURE

CROSS-REFERENCE TO RELATED APPLICATION

This application claims priority to U.S. Provisional Patent Application No. 62/737,314, filed Sep. 27, 2018, the entire contents of which are incorporated herein by reference.

FIELD OF THE DISCLOSURE

This relates generally to a sensor readout architecture and more particularly to a configurable AC/DC sensor readout architecture.

BACKGROUND OF THE DISCLOSURE

Magnetic sensing technology can be used to detect changes, or disturbances (e.g., changes in magnetic field strength), in magnetic fields and can be used to measure the precise location/positioning of an electronic device in proximity to a magnetic source. In order to avoid interference by Earth's static magnetic field, a modulated magnetic field can be used for magnetic based proximity sensing. Received modulated magnetic field signals can be demodulated to determine proximity of the sensor to the source of the modulated magnetic field. At the same time, static magnetic field measurements can be useful in detecting an object's position and orientation relative to static magnetic fields such as Earth's magnetic field and magnetic fields from permanent magnets or DC currents. Some sensor systems that contain both AC and DC signal sources utilize separate circuitry for AC sensor readout and DC sensor readout. While this configuration can be used to effectively process the AC and DC sensor signals, the receiver circuitry can consume a large amount of power and occupy a large amount of space on the receiver chip within the device.

SUMMARY OF THE DISCLOSURE

This disclosure relates to a configurable AC/DC readout architecture that can be operated in an AC measurement mode or a DC measurement mode utilizing shared circuitry such as amplifiers and analog-to-digital converters (ADCs). The configurable AC/DC architecture is explained in conjunction with an exemplary sensor configuration utilizing a magnetic sensor based proximity sensing architecture. In the AC measurement mode, the magnetic sensor based proximity sensing architecture can enable precise location/positioning of electronic devices (e.g. smartphone, tablet, other handset or wearable devices) in proximity to a modulated magnetic source is discussed. In the DC measurement mode, the magnetic sensor based proximity sensing architecture can measure DC magnetic fields such as Earths' magnetic field and magnetic fields caused by permanent magnets and DC currents. The configurable AC/DC readout can also be used with other sensor configurations where both AC and DC measurement signals are captured and require readout and conversion to digital signals.

BRIEF DESCRIPTION OF THE DRAWINGS

For a better understanding of the various described examples, reference should be made to the Detailed Description below, in conjunction with the following drawings in which like reference numerals refer to corresponding parts throughout the figures.

DETAILED DESCRIPTION

Figure 1:
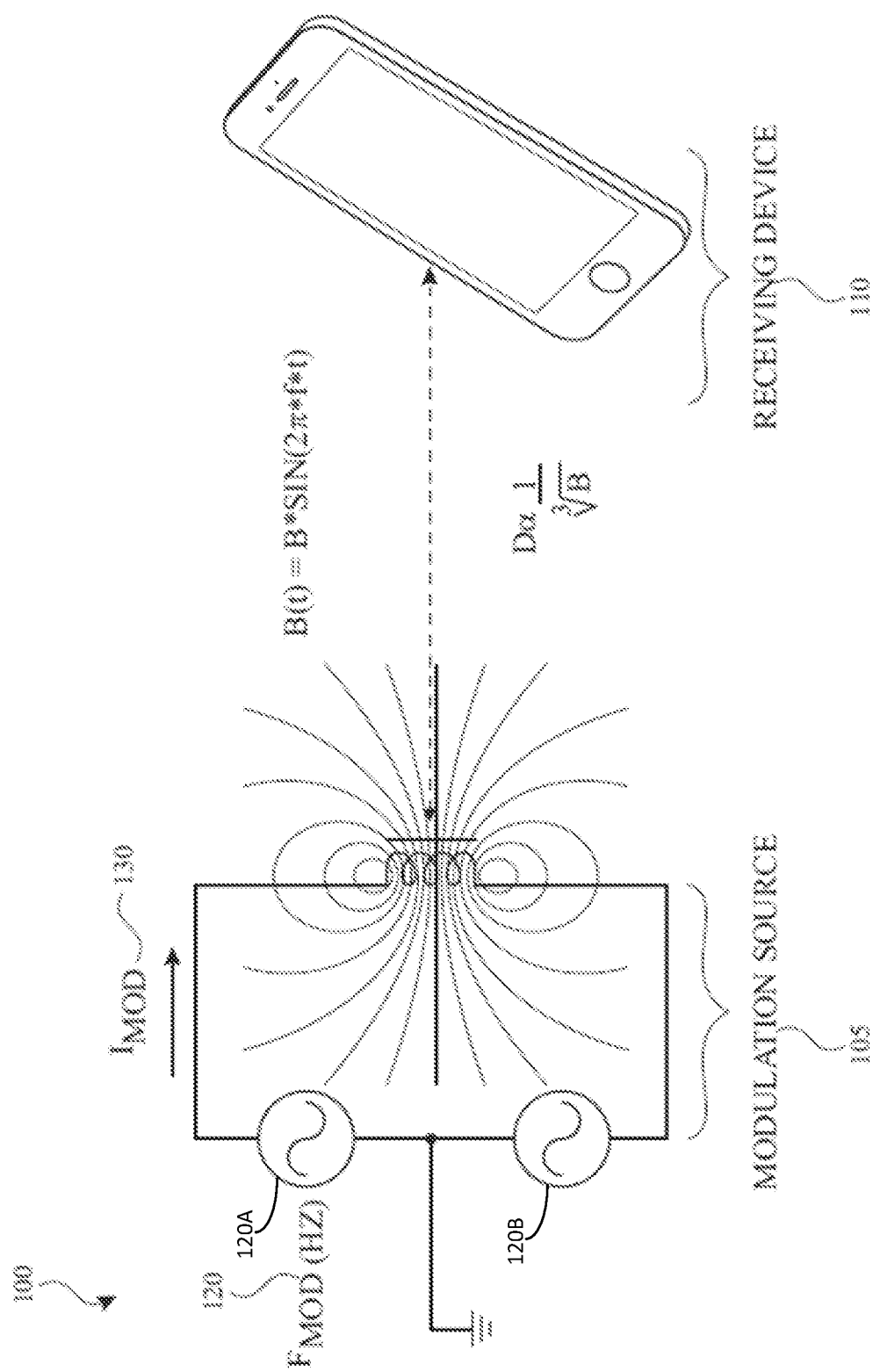
FIG. 1 illustrates an exemplary architecture based on magnetic sensor based proximity sensing according to examples of the disclosure.

In the following description of examples, reference is made to the accompanying drawings which form a part hereof, and in which it is shown by way of illustration specific examples that can be optionally practiced. It is to be understood that other examples can be used and structural changes can be made without departing from the scope of the disclosed examples.

Various techniques and process flow steps will be described in detail with reference to examples as illustrated in the accompanying drawings. In the following description, numerous specific details are set forth in order to provide a thorough understanding of one or more aspects and/or features described or referenced herein. It will be apparent, however, to one skilled in the art, that one or more aspects and/or features described or referenced herein may be practiced without some or all of these specific details. In other instances, well-known process steps and/or structures have not been described in detail in order to not obscure some of the aspects and/or features described or referenced herein.

Further, although process steps or method steps can be described in a sequential order, such processes and methods can be configured to work in any suitable order. In other words, any sequence or order of steps that can be described in the disclosure does not, in and of itself, indicate a requirement that the steps be performed in that order. Further, some steps may be performed simultaneously despite being described or implied as occurring non-simultaneously (e.g., because one-step is described after the other step). Moreover, the illustration of a process by its depiction in a drawing does not imply that the illustrated process is exclusive of other variations and modification thereto, does not imply that the illustrated process or any of its steps are necessary to one or more of the examples, and does not imply that the illustrated process is preferred.

This disclosure relates to a configurable AC/DC sensor readout architecture that can use shared components (e.g., on a single ASIC) for performing both DC and AC signal readouts. For the purposes of illustration, the AC/DC sensor readout architecture is discussed in conjunction with a magnetic sensor based proximity sensing configuration that can detect both AC and DC magnetic fields. The configurable AC/DC sensor readout architecture can be configured in an AC measurement mode or a DC measurement mode to accommodate both the AC and DC signal components detected by the magnetic sensor based proximity sensing configuration. However, it should be understood that the configurable AC/DC sensor readout architecture can be used with other sensor configurations where both AC measurements and DC measurements may be required at different times.

Representative applications of methods and apparatus according to the present disclosure are described below. These examples are being provided solely to add context and aid in the understanding of the described examples. It will thus be apparent to one skilled in the art that the described examples may be practiced without some or all of the specific details. In other instances, well-known process steps have been described in detail in order to avoid unnecessarily obscuring the described examples. Other applications are possible, such that the following examples should not be taken as limiting.

Magnetic sensing technology can be used to detect changes, or disturbances (e.g., changes in magnetic field strength), in magnetic fields and can be used to measure the precise location/positioning of an electronic device in proximity to a magnetic source. In order to avoid interference by Earth's static magnetic field, a modulated magnetic field can be used for magnetic based proximity sensing. Received modulated magnetic field signals can be demodulated to determine sensor proximity to the source of the modulated magnetic field. At the same time, static magnetic field measurements can be useful in detecting an object's position and orientation relative to static magnetic fields such as Earth's magnetic field and magnetic fields from permanent magnets or DC currents.

FIG. 1 illustrates an exemplary architecture of magnetic sensor based proximity sensing according to examples of the disclosure. The magnetic sensor based proximity sensing architecture 100 can include a modulation source 105 and a receiving device 110. In some examples, a differential modulation voltage source pair (120A, 120B) can be modulated at a single tone frequency ($f_{mod}$, or $f_c$ as used elsewhere herein) can generate a corresponding modulation current $I_{mod}$ 130. In some examples, an electromagnetic coil (e.g., spiral, cylindrical, or circular) excited by the modulation current can generate a modulated magnetic field B(t). In some examples, a receiving device 110 can receive the modulated magnetic field (e.g., at a corresponding coil) and perform demodulation on the current induced in the coil by the magnetic field. The distance d between electronic device and coil can be determined based on the magnetic field amplitude after demodulation is approximately proportional to the inverse of the cube root of magnetic field strength. In some examples, a magnetic sensor arrangement that is capable of detecting both distance and direction can be utilized to obtain additional information about the positioning of an electronic device. For example, a magnetic sensor arrangement can be configured to detect magnetic field components for multiple directions (e.g., x, y, and z components), and the multiple field components can be used to determine a three-dimensional position of the electronic device. In some examples, the multiple directional components can be obtained by including multiple magnetic sensors oriented to be sensitive to magnetic field variation in orthogonal directions. In some examples, a three-axis sensor can be used to determine the direction of the magnetic field as well as the distance.

By using a modulated magnetic field from the modulation source 105, a magnetic sensing configuration that rejects the effects of magnetic interferences such permanent magnets, Earth's magnetic field, and DC power sources, etc. can be realized. In some examples, the use of a modulated magnetic field may also offer improved stability against environmental interferences as the magnetic field measurement can be locked at a specific operation frequency which provides the opportunity to filter unwanted AC interferences from other frequency bands. In some examples, the use of a modulated magnetic field may also offer improved stability over long term drift, e.g., magnetic sensor offset drift and coil magnetic field drift due to thermal heating. For example, to the extent that the effects of magnetic sensor offset drive and coil magnetic field drift manifest as a DC offset at the output of a magnetic sensor, the DC offset component can be filtered out after demodulation in an AC sensing mode.

At the same time, although the Earth's magnetic field and other DC magnetic fields can be considered interferences with respect to the proximity sensing function above, measurement of the DC magnetic field components can also yield useful results such as object orientation and proximity to permanent magnets in proximity to an electronic device. Accordingly, as will be discussed below, a configurable AC/DC sensing architecture can allow for AC signal measurement when proximity sensing based on modulated magnetic fields is desired, and can also allow for DC signal measurement when measurement of DC magnetic fields are desired. The configurable AC/DC sensing architecture can achieve both measurement types using shared hardware, thus reducing overall area of the circuitry as well as potentially reducing overall power consumption.

Figure 2:
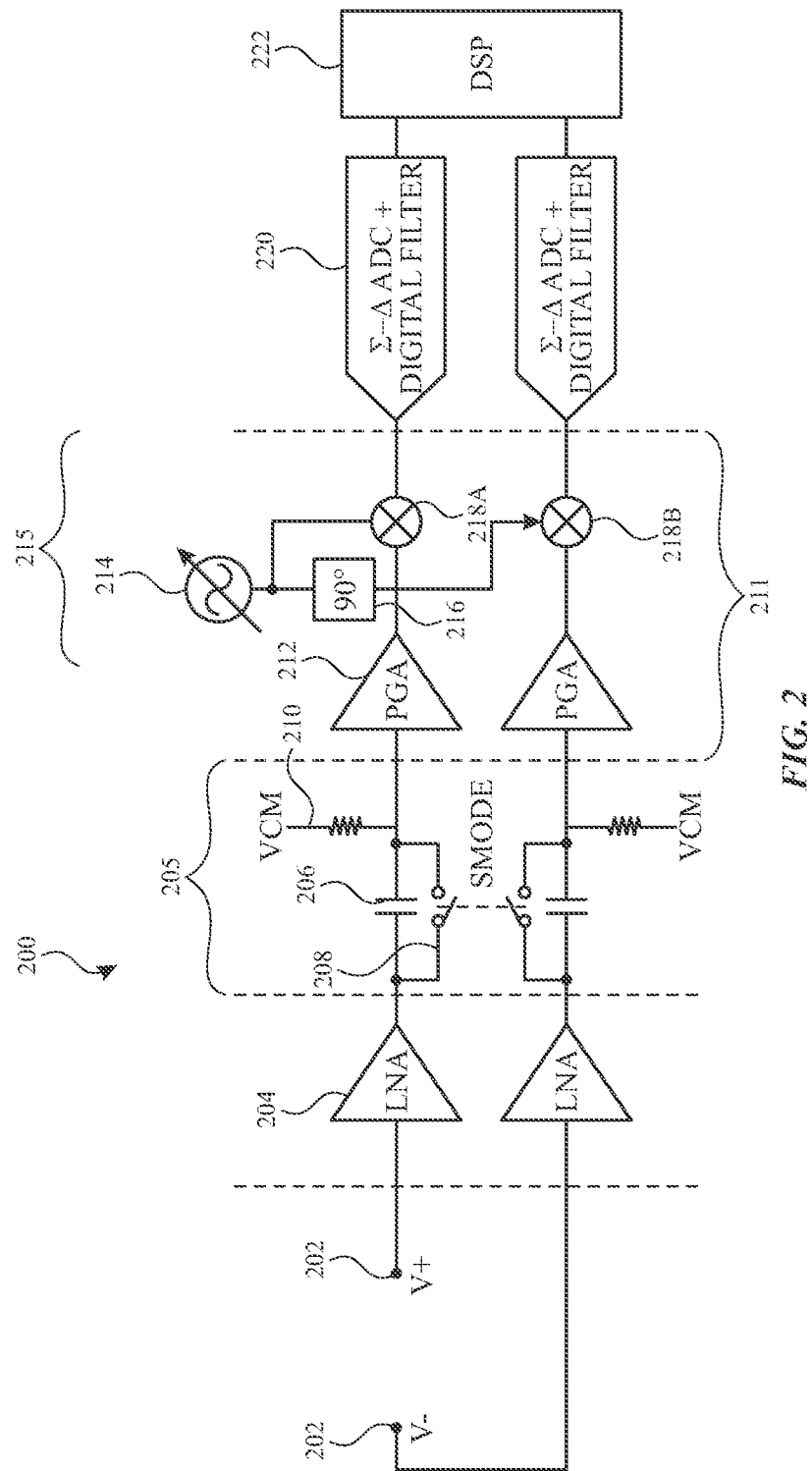
FIG. 2 illustrates an exemplary configurable AC/DC sensing architecture according to examples of the disclosure.

FIG. 2 illustrates an exemplary configurable AC/DC sensing architecture 200 according to examples to disclosure. In some examples, the AC/DC sensing architecture can have a differential input 202. In some examples, the differential input can come from a sensor capable of receiving both AC and DC inputs. One example input signal source for the AC/DC sensing architecture that will be described throughout the present disclosure is a magnetoresistive sensor, although it should be understood that the AC/DC sensing architecture 200 can be used for other types of sensors capable of producing AC and DC inputs without departing from the scope of the present disclosure. In some examples, each of the differential inputs 202 can have an associated signal chain with identical components. For simplicity, the signal chain with respect to the positive input V+ will be described, and it should be understood that the signal chain with respect to the negative input V− can include corresponding components. In some examples, the differential input 202 can be amplified at low noise amplifier (LNA) 204. In some examples, the LNA can have a fixed gain, and in some examples the LNA can have a variable gain. The output of the variable gain amplifier 204 can be coupled to an input side of a mode selection circuit 205. The selection circuit 205 can include a DC filtering capacitor 206 in parallel with a bypass switch 208. The bypass switch 208 can be operated by a control signal $S_{mode}$. In some examples, the control signal $S_{mode}$ can be used to open the bypass switch 208, thereby selecting an AC measurement configuration. With the bypass switch 208 open, DC current cannot pass the capacitor 206 and as a result only AC input signals from the LNA output can reach the programmable gain and analog demodulator block 211. In some examples, the programmable gain and analog demodulator block 211 can include programmable gain amplifier (PGA) 212 and an analog demodulator 215. The analog demodulator 215 can be comprised of an oscillator 214, a 90 degree phase shifter 216 and mixers 218. In some examples, the oscillator 214 can provide a signal at the carrier frequency (e.g., $f_c$) of AC input modulation for the input signals received at the differential input 202. The selection circuit 205 can further include a common mode biasing circuit 210, which as illustrated includes a resistor coupled on one end to the output side of the selection circuit and on the other end to a common mode biasing voltage ($V_{CM}$). In the AC measurement configuration, since there is no DC current path from the input side of the selection circuit 205, the biasing circuit 210 can be used to provide a DC bias point to the input of the PGA and analog mixer block 211. In some examples, the control signal $S_{mode}$ can close the bypass switch 208, thereby bypassing the capacitor 206 and providing a DC current path from the LNA output to the programmable gain amplifier 212. In some examples, PGA 212 can be used to apply a variable gain to an AC input signal in the AC measurement configuration or a DC input signal in the DC measurement configuration. In some examples, a programmable gain of the PGA 212 can allow for a single amplifier to be used even when the relative dynamic range of the two types of signals (AC and DC) varies significantly. Specifically, in some examples, the PGA 212 can scale the signal levels both AC and DC signal input paths to be within a signal conversion capability of an analog-to-digital converter (ADC) 220. The ADC 220 can convert the analog signal output of the PGA and analog mixer block 211 into a digital signal. The ADC 220 can also include a digital filter to extract desired signal information and filter out spectral components that are not of interest (e.g., filtering out DC input components in the AC measurement configuration and filtering out AC input components in the DC measurement configuration). The outputs of the ADC 220 can be provided to a digital signal processor 222, which can be used to process the measured signal for specific use conditions. In some examples, by providing a shared architecture for AC and DC readout, a total size of an application specific integrated circuit (ASIC) can be reduced due to reduction in duplication of components as compared to an architecture that provides separate signal chains for AC and DC readout. In some examples, all the components LNA 204, selection circuit 205, PGA 212, analog demodulator 215, ADC and digital filter 220, and DSP 222 can be included in a single ASIC and shared for both AC and DC measurement configurations. In some examples, one or more of the above listed components may be provided separately from a shared ASIC. It should be understood that the AC/DC sensing architecture 200 for AC and DC readout can be used for any application where AC and DC signal sensing is needed in a single device. Some exemplary AC signal sources that can be used with the architecture disclosed herein include ultrasonic sensing, capacitive sensing, optical sensing, and magnetoresistive sensing. In some examples a shared readout can reduce total power consumption compared to a larger number of components. As explained above, FIG. 2 describes the configurable AC/DC readout architecture 200 with a generic differential input 202 that can be used for many different types of signal input sources. The following FIGS. 3-5 provide more detail on the specific case of a magnetoresistance based sensor configuration utilizing the configurable AC/DC readout architecture according to examples of the disclosure.

Figure 3:
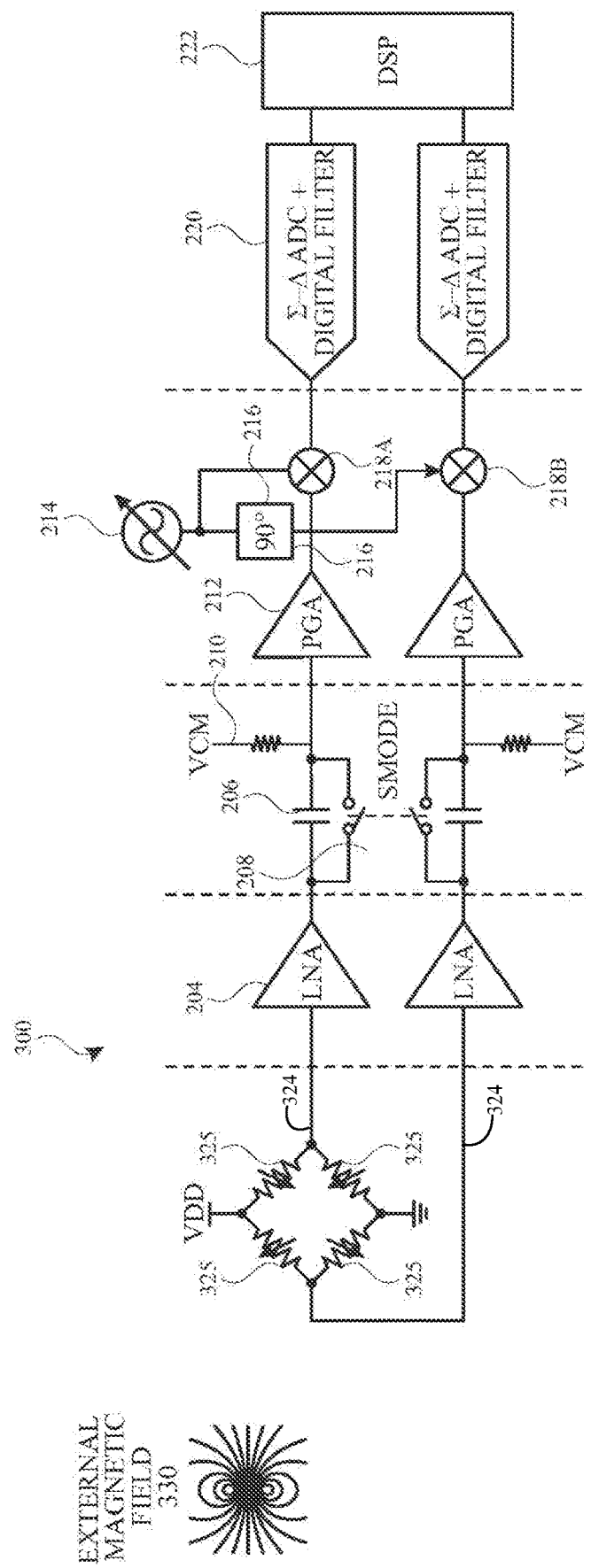
FIG. 3 illustrates an exemplary configurable AC/DC sensing architecture with a magnetic sensor input according to examples of the disclosure.

FIG. 3 illustrates an exemplary configurable AC/DC sensing architecture 300 with a magnetoresistance based input 324 according to examples of the disclosure. In particular, FIG. 3 includes the exemplary configurable AC/DC sensor architecture 200 as illustrated and described above with regard to FIG. 2. In the example of FIG. 3, the magnetoresistance based input 324 is illustrated as a wheatstone bridge comprised of four magnetoresistors 325 arranged between a supply voltage (VDD) and ground as illustrated in the figure. In some examples, the magnetoresistors 325 can be used to sense the strength of external magnetic field 330. In some examples, the external magnetic field 330 can have a DC component $B_0$ which can include Earth's magnetic field and other DC magnetic fields, e.g., from a permanent magnet or a DC current passing through a conductor. In some examples, the external magnetic field can have AC components, which can include a modulated magnetic field (e.g., from modulation source 105 in FIG. 1). As shown in FIG. 1, the modulated magnetic field can take the form of $B(t)=B*SIN(2*\pi*f_c*t+\alpha)$, where $f_c$ is the modulation carrier frequency and $a$ is a signal phase of the modulated signal. In some examples, the output of the wheatstone bridge formed from magnetoresistors 325 can produce the magnetoresistance based input 324 to the configurable AC/DC sensor architecture 200. In some examples, it should be understood that the magnetoristance based input 324 is a measurement of the AC and DC components of the external magnetic field 330 that is converted into a voltage across the two inputs of the configurable AC/DC sensor architecture 200. FIGS. 4 and 5 below illustrate the effective circuit configuration of the configurable AC/DC sensor architecture 200 with magnetoresistance based input 324 when the DC measurement configuration and AC measurement configuration are selected, respectively.

Figure 4:
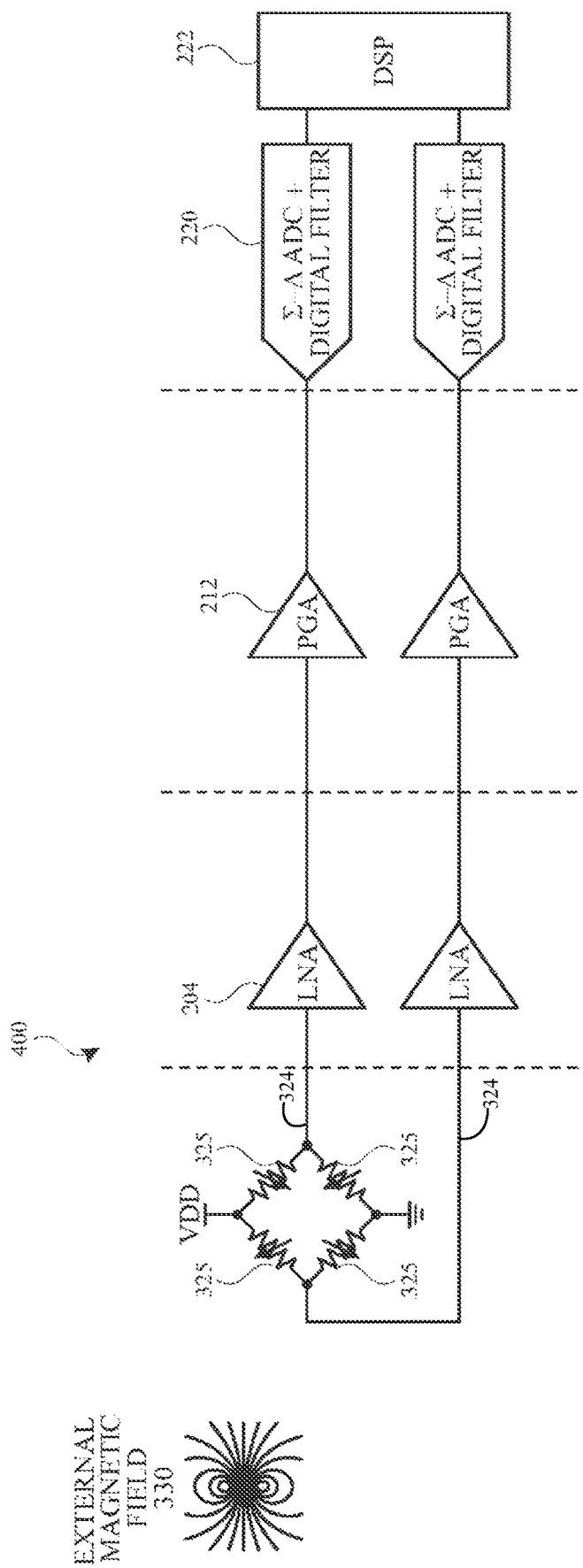
FIG. 4 illustrates the exemplary configurable AC/DC sensing architecture with a magnetic sensor input in a DC configuration according to examples of the disclosure.

FIG. 4 illustrates the exemplary configurable AC/DC sensing architecture (e.g., 200 above) with a magnetoresistance based input 324 in a DC measurement configuration 400 according to examples of the disclosure. As shown in FIG. 4, the selection circuit 205 can effectively disappear from the equivalent circuit in the DC measurement configuration 400. As explained in FIG. 2 above, the bypass switch 208 can be closed in the DC measurement configuration, thus bypassing the capacitor 206 and providing a signal path for a DC input signal amplified by the LNA 204. In addition, the reference voltage ($V_{CM}$) for the common mode bias circuit 210 can be left floating in the DC measurement configuration because the DC output voltage of the LNA 204 can be used to bias the input of the PGA 212. In some examples, an additional bypass switch (not shown) can be used to disconnect the common mode bias circuit 210 from the PGA input in the DC measurement configuration. In addition, because the DC measurement configuration 400 is used for measuring the DC component ($B_0$) of the external magnetic field, there is no demodulation necessary from the demodulators 215. In some examples, the demodulators 215 can be disabled by providing a DC signal from the local oscillator 214 input into the mixers 218. In some embodiments, an additional bypass switch (not shown) can be used to bypass the demodulators 215. In the DC measurement configuration illustrated in FIG. 4, the output of the PGA 212 can be coupled to the input of the ADC 220, where digital filtration can be used to remove any signal components from modulated magnetic fields, and the output of the ADC 220 can be proportional to the DC component ($B_0$) of the external magnetic field 330. The digitized output from the ADC 220 can be coupled to the DSP 222 for further analysis.

Figure 5:
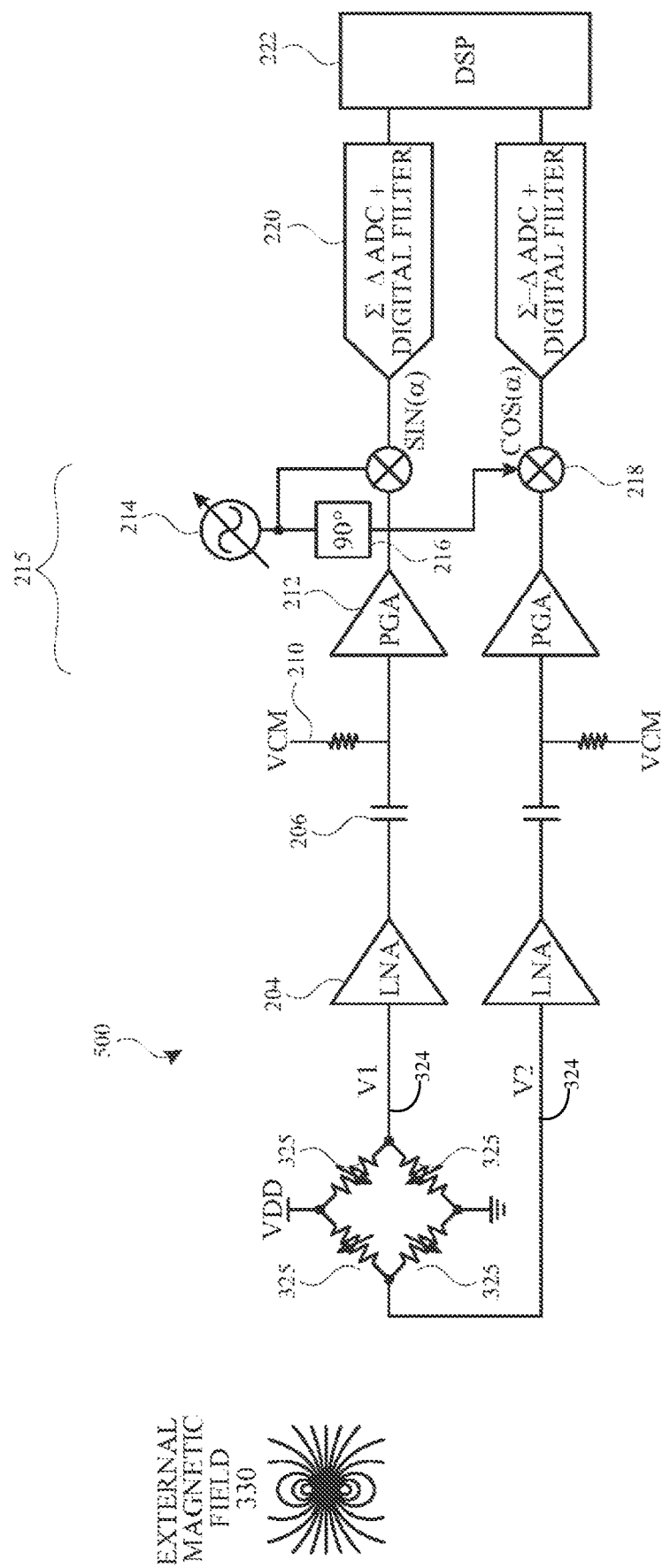
FIG. 5 illustrates the exemplary configurable AC/DC sensing architecture with a magnetic sensor input in a DC configuration according to examples of the disclosure.

FIG. 5 illustrates the exemplary configurable AC/DC sensing architecture with a magnetoresistance based input 324 in an AC measurement configuration 500 according to examples of the disclosure. As shown in FIG. 5, when the bypass switch 208 of the selection circuit 205 is left open, the signal path for the output of LNA 204 passes through the capacitor 206, which can serve as a DC filter, as DC current cannot pass through a capacitor. As further shown in FIG. 5, the common mode biasing circuit 210 can provide a DC bias to the input of the PGA 212 by connecting a resistor between a common mode bias voltage ($V_{cm}$) and the PGA input. In the AC measurement configuration 500, the PGA 212 can accordingly receive the AC component of the external magnetic field 330 as measured by the magnetoresistance based input 324. It should be understood that the combination of the LNA 204 and PGA 212 can function in tandem to condition the outputs of the magnetoresistance based input 324 to optimize the SNR of the detected modulated AC signal. In some examples, the amplified output signal from the PGA be input into a demodulator 215. The output signal for local oscillator 214 can be provided directly to mixer 218A and a 90 degrees phase shifted version of the output signal for the local oscillator can be provided to mixer 218B. In such a configuration, in-phase (I) and quadrature (Q) baseband components of the demodulated signal can be extracted in the two channels of the differential sensing architecture of FIG. 5. In some examples, the output signals from the demodulator 215 can be input into ADC and digital filter 220. In the AC configuration, the digital filter can be used to filter out DC components of the signal received at magnetoresistive based input 324 that are subsequently shifted by the demodulation performed at demodulator 215 into out of band signals. In some examples, as a result of demodulating the signal from the AC magnetic field into the base band and filtering out the out of band shifted DC components, a high bandwidth ADC may not be required for the AC signal digitization. In some examples, the output of the ADC and digital filter 220 can represent amplitude information of the AC modulated component of external magnetic field 330. In some examples, the outputs of ADC and digital filters 220 from both channels can be input into a DSP 222 for further analysis (e.g., to determine the distance between the transmitter of the modulated magnetic field and the receiver 500 based on the amplitude of the modulated magnetic field component).

Figure 6:
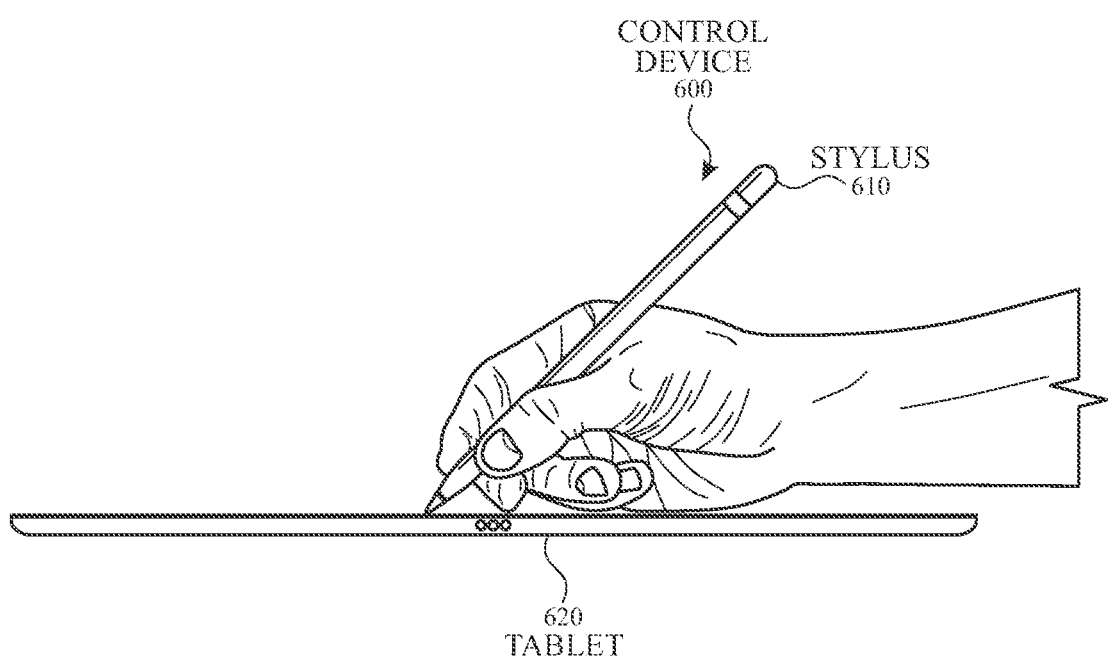
FIG. 6 illustrates an exemplary architecture based on magnetic sensor based proximity sensing in a stylus-tablet system according to examples of the disclosure.
Figure 7:
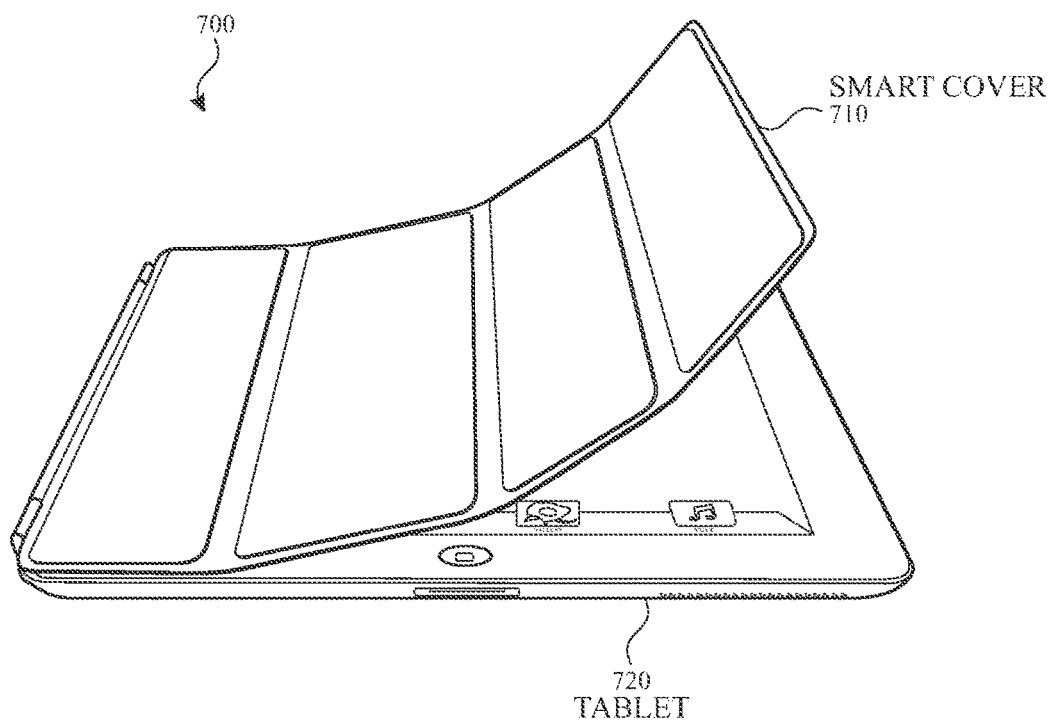
FIG. 7 illustrates an exemplary architecture based on magnetic sensor based proximity sensing in a smart tablet cover system according to examples of the disclosure.
Figure 8:
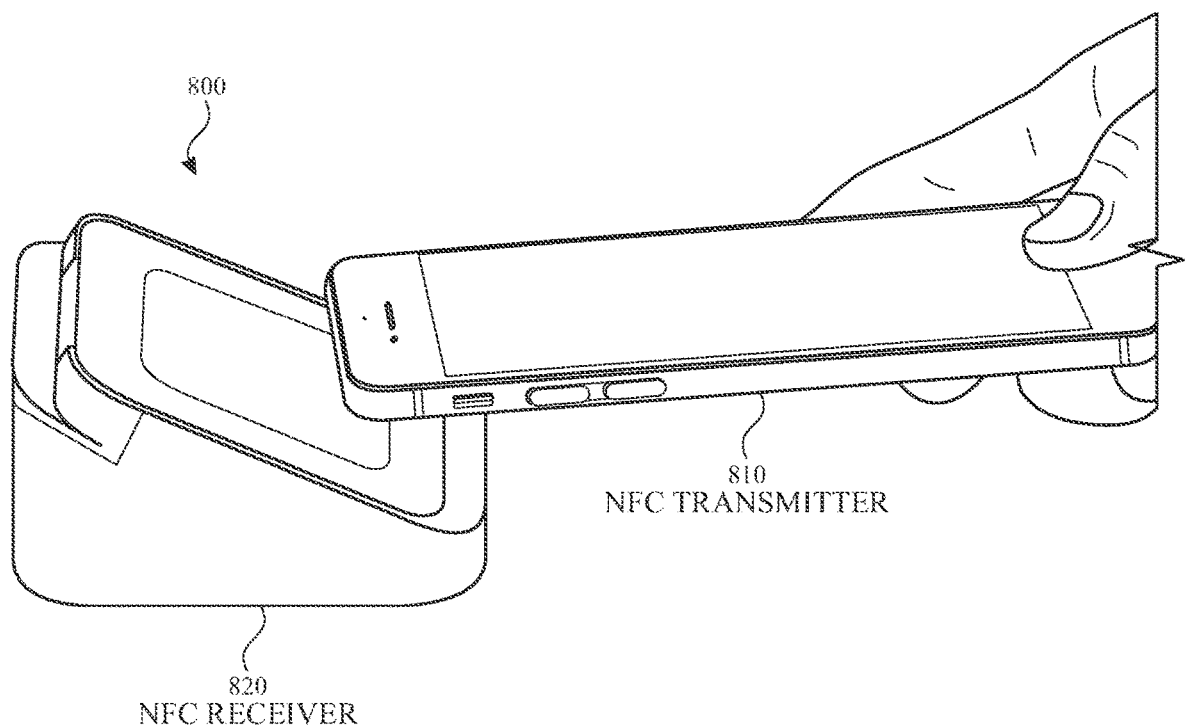
FIG. 8 illustrates an exemplary architecture based on magnetic sensor based proximity sensing in a Near Field Communication system according to examples of the disclosure.

The configurable AC/DC architecture of the present disclosure can be useful in many different applications. Specifically, with regard to the magnetic sensor based proximity detection described above, the configurable AC/DC readout architecture in the AC measurement mode can be used for detecting the relatively position between essentially any two objects where at least one of the objects includes a magnetic transmitter and the other of the two objects contains a magnetic sensor. Such magnetic based sensing can have many applications such as detecting the position and movement of a wearable device, detecting distance and relative position between two electronic devices such as laptops, mobile phones, wearable devices, sensing relative position of displays in a multiple display arrangement, and sensing a distance between an electronic device and an accessory for the electronic device and many other applications. FIGS. 6-8 illustrate three exemplary applications where magnetic sensor based proximity sensing can be used and the configurable AC/DC readout architecture of the present disclosure can be used as the readout circuit to provide both AC and DC measurement capabilities.

FIG. 6 illustrates an exemplary architecture based on magnetic sensor based proximity sensing in a stylus-tablet system 600 according to examples of the disclosure. In some examples, the magnetic field generator can be located in the tablet 620 and a magnetic sensor can be located in the stylus 610. In some examples, a magnetic field generator can be provided in each corner of the tablet 620, and distances from each of the four corners can be used to determine the position of the stylus 610 relative to the tablet. In some examples, the stylus 610 can include a magnetic sensor based proximity sensor on each end of the stylus, allowing both distance and orientation of the stylus to be detected. In some examples, magnetic sensor based proximity sensing can be used to perform gesture recognition between the tablet and the stylus without requiring the stylus to contact the sensing surface. In some examples, the configurable AC/DC readout architecture of the present disclosure can be used to perform readout of the magnetic sensor based proximity sensing described above in the AC measurement mode. The configurable AC/DC readout architecture of the present disclosure can also perform readout of DC magnetic fields using shared hardware components as described above.

FIG. 7 illustrates an exemplary architecture based on magnetic sensor based proximity sensing in a smart tablet cover system 700 according to examples of the disclosure. In some examples, a magnetic field generator can be located in the tablet 720 and a magnetic sensor can be located in the smart cover 710. In some examples, magnetic sensor based proximity sensing according to examples of the disclosure can be used to determine whether the cover is open, as well as how far the cover is open. Compared to cover based on static magnetic fields for determining whether the cover is open, a system based on magnetic sensor based proximity sensing using modulated magnetic sensor can have improved immunity to the effects of interfering magnetic fields. For example, a smart cover incorporating a modulated magnetic field sensor may not falsely cause a device to turn on or off in the presence of a static magnetic field from a source other than the tablet 720. A similar application can be the use of a magnetic sensor to track a relative position of a tablet (e.g., 720), a phone, a wearable electronic device, or other electronic device and a wireless charging accessory such as a mat, stand, pad, or the like. In such an example, the mat, stand, or pad can include a magnetic field generator that generates an AC magnetic field, and the electronic device can include a sensor that can be used to detect the generated magnetic field. In each of the examples above, the configurable AC/DC readout architecture of the present disclosure can be utilized in an AC measurement mode to perform readout of the magnetic sensor based proximity sensing described above. The configurable AC/DC readout architecture of the present disclosure can also perform readout of DC magnetic fields using shared hardware components as described above.

FIG. 8 illustrates an exemplary architecture based on magnetic sensor sensing of a modulated magnetic field in a Near Field Communication system 800 according to examples of the disclosure. Magnetic sensor based communication sensing can be used to enhance the performance of a Near Field Communication system. Near Field Communication system generally needs precise alignment between the transmitter and the receiver but with the magnetic sensor based sensing, a greater amount of misalignment can be tolerated. In some examples, a modulated magnetic field based NFC transmitter 810 can be included in an electronic device. In some examples, an NFC receiver 820 can include a magnetic sensor with an AC/DC sensing architecture according to examples of the disclosure. In some examples, the NFC transmitter 810 can be used to transmit information from the electronic device to the NFC receiver 820 in an AC configuration according to examples of the disclosure (e.g., as described in FIG. 5 above).

Therefore, according to the above, some examples of the disclosure are directed to a configurable readout architecture comprising a first sensing channel comprising: a front end amplifier having an input coupled to a sensor and an output coupled to an input of a mode selection circuit, the mode selection circuit comprising: a filter circuit configured to filter out a DC signal component from the front end amplifier output, and a filter bypass circuit in parallel to the filter circuit, a programmable gain amplifier having an input coupled to an output of the mode selection circuit; a demodulation circuit coupled to an output of the programmable gain amplifier and configured to: demodulate the output of the mode selection circuit when an AC configuration is activated, and allow the output of the mode selection circuit to pass without demodulation when the AC configuration is deactivated, and an analog-to-digital converter configured to convert an output of the mixing circuit both when the AC configuration is activated and when the AC configuration is deactivated. Additionally or alternatively to one or more of the examples disclosed above, in some examples, the filter bypass circuit is a switch, the switch configured to open when the AC configuration is activated and close, thereby bypassing the filter circuit, when the AC configuration is deactivated. Additionally or alternatively to one or more of the examples disclosed above, in some examples, the filter circuit comprises a capacitor having two terminals connected between the input of the mode selection circuit and the output of the mode selection circuit. Additionally or alternatively to one or more of the examples disclosed above, in some examples, the demodulation circuit comprises: a local oscillator, and a mixer coupled to the local oscillator, wherein the local oscillator provides an AC signal to the mixer when the AC configuration is activated, and the local oscillator provides a DC signal to the mixer when the AC configuration is deactivated. Additionally or alternatively to one or more of the examples disclosed above, in some examples, the configurable readout architecture further comprises a second sensing channel comprising a second mixer, wherein a 90 degree phase shifter is coupled between the local oscillator and the second mixer, an output of the second mixer coupled to a second analog-to-digital converter. Additionally or alternatively to one or more of the examples disclosed above, in some examples, the output of the analog-to-digital converter and the second analog-to-digital converter are coupled to a digital signal processor.

Although the disclosed examples have been fully described with reference to the accompanying drawings, it is to be noted that various changes and modifications will become apparent to those skilled in the art. Such changes and modifications are to be understood as being included within the scope of the disclosed examples as defined by the appended claims.

The invention claimed is:

1. A configurable readout architecture comprising:
a first sensing channel comprising:
    a front end amplifier having an input coupled to a sensor and an output coupled to an input of a mode selection circuit;
    the mode selection circuit comprising:
        a filter circuit configured to filter out a DC signal component from the front end amplifier output; and
        a filter bypass circuit in parallel to the filter circuit;
    a programmable gain amplifier having an input coupled to an output of the mode selection circuit;
    a demodulation circuit coupled to an output of the programmable gain amplifier and configured to:
        demodulate the output of the mode selection circuit when an AC configuration is activated; and
        allow the output of the mode selection circuit to pass without demodulation when the AC configuration is deactivated; and
    an analog-to-digital converter configured to convert an output of the demodulation circuit both when the AC configuration is activated and when the AC configuration is deactivated.

2. The configurable readout architecture of claim 1, wherein the filter bypass circuit is a switch, the switch configured to open when the AC configuration is activated and close, thereby bypassing the filter circuit, when the AC configuration is deactivated.

3. The configurable readout architecture of claim 1, where the filter circuit comprises a capacitor having two terminals connected between the input of the mode selection circuit and the output of the mode selection circuit.

4. The configurable readout architecture of claim 1, wherein the demodulation circuit comprises:
a local oscillator; and
a mixer coupled to the local oscillator, wherein the local oscillator provides an AC signal to the mixer when the AC configuration is activated, and the local oscillator provides a DC signal to the mixer when the AC configuration is deactivated.

5. The configurable readout architecture of claim 4, wherein the configurable readout architecture further comprises a second sensing channel comprising a second mixer, wherein a 90 degree phase shifter is coupled between the local oscillator and the second mixer, an output of the second mixer coupled to a second analog-to-digital converter.

6. The configurable readout architecture of claim 5, wherein the output of the analog-to-digital converter and the second analog-to-digital converter are coupled to a digital signal processor.

* * * * *